US012631671B2

(12) United States Patent
Ganesan et al.

(10) Patent No.: US 12,631,671 B2
(45) Date of Patent: May 19, 2026

(54) OVER-VOLTAGE TOLERANT POWER SUPPLY SENSING CIRCUIT WITH PROGRAMMABLE TRIP-POINT

(71) Applicant: Advanced Micro Devices, Inc., Santa Clara, CA (US)

(72) Inventors: Thanapandi Ganesan, Sivangangai (IN); Prateek Mishra, Kanpur (IN); Pramod Baliga Kokkada, Bangalore (IN); Rajesh Mangalore Anand, Bangalore (IN); Aniket Bharat Waghide, Chandrapur (IN); Animesh Jain, Bangalore (IN); Girish Anathahally Singrigowda, Bengaluru (IN); Dhruvin Devangbhai Shah, Ahmedabad (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 620 days.

(21) Appl. No.: 18/089,057

(22) Filed: Dec. 27, 2022

(65) Prior Publication Data

US 2024/0210449 A1     Jun. 27, 2024

(51) Int. Cl.
G01R 19/165        (2006.01)
(52) U.S. Cl.
CPC .............................. G01R 19/16528 (2013.01)
(58) Field of Classification Search
CPC .......................... G01R 19/16528; H03K 3/012
See application file for complete search history.

(56) References Cited

U.S. PATENT DOCUMENTS

| | | | |
|---|---|---|---|
| 10,305,474 B2 | 5/2019 | Lee | |
| 10,992,290 B2 | 4/2021 | Kim et al. | |
| 11,418,189 B2 | 8/2022 | Singrigowda et al. | |
| 11,463,084 B1 | 10/2022 | Ganesan et al. | |
| 2003/0137336 A1* | 7/2003 | Okamoto | H03K 19/00323 |
| | | | 327/333 |
| 2003/0151865 A1* | 8/2003 | Maio | H03F 1/523 |
| | | | 361/52 |
| 2015/0028921 A1* | 1/2015 | Sforzin | H03K 3/012 |
| | | | 327/108 |

(Continued)

FOREIGN PATENT DOCUMENTS

| | | | | |
|---|---|---|---|---|
| CN | 106100639 A | * | 11/2016 | H03M 1/1245 |

*Primary Examiner* — Daniel C Puentes
(74) *Attorney, Agent, or Firm* — Zagorin Cave LLP

(57)        ABSTRACT

A power sensing circuit in a first voltage domain senses an input voltage from a second voltage domain and provides a power OK signal. The maximum supply voltage of the first voltage domain is above a maximum tolerance for devices in the first voltage domain. Accordingly, protection techniques are employed to ensure that the potential difference between any two terminals of devices in the power sensing circuit does not exceed the maximum tolerance limit. The protection techniques utilize reference voltage-based techniques including level shifting and use of protection devices in transistor stacks. An over-voltage tolerant Schmitt trigger circuit is also employed in the power sensing circuit. A trip point device on the input of the power sensing circuit utilizes a programmable bias voltage to adjust the trip point of the power sensing circuit to accommodate different maximum input voltages from the second voltage domain.

18 Claims, 10 Drawing Sheets

(56)  References Cited

U.S. PATENT DOCUMENTS

| | | |
|---|---|---|
| 2015/0280714 A1 | 10/2015 | Kumar |
| 2016/0072502 A1 | 3/2016 | Chern et al. |
| 2021/0067158 A1 | 3/2021 | Wu |
| 2021/0384895 A1* | 12/2021 | Kumar ................. H03K 3/3565 |

* cited by examiner

| Node | Initial Conditions | Final Conditions |
|---|---|---|
| VDDDST | 1.8V | 1.8V |
| VDDSRC | 0V | 0.6V |
| VDD_DIV | 0V | 0.6V |
| PSNIFF_INT | 1.8V | 0V |
| NET_N | 0V | 1.4V |
| PWROK | 0V | 1.8V |
| VREFL | 0.1V | 0.1V |
| VREFM | 0.8V | 0.8V |
| VREFH | 1.4V | 1.4V |

Fig. 6

| MOSFET | Initial Conditions | | Final Conditions | |
|---|---|---|---|---|
| | Vgs | Status | Vgs | Status |
| P1 | 0 | OFF | VDDSRC-VREFL = 0.5V | ON |
| N1 | 0 | OFF | VDDSRC=0.6V | ON |
| N2 | 0 | OFF | VDDSRC=0.6V | ON |
| N3 | 0 | OFF | VREFH | ON |
| N4 | Vth | ON | Vth | ON |
| N5 | Vth | ON | Vth | ON |
| N6 | VREFH | ON | VREFH | OFF |
| N7 | 0 | OFF | VDDDST-VREFH = 0.4V | ON |
| N8 | VREFM | ON | VREFM-Vth = 0.4V | ON |
| N9 | 0 | OFF | Vth | ON |

Fig. 7

| Node | Initial Conditions | Final Conditions |
|---|---|---|
| VDDDST | 1.8V | 1.8V |
| VDDSRC | 0V | 1.32V |
| VDD_DIV | 0V | 1.32V |
| PSNIFF_INT | 1.8V | 0V |
| NET_N | 0V | 1.4V |
| PWROK | 0V | 1.8V |
| VREFL | 0.36V | 0.36V |
| VREFM | 0.8V | 0.8V |
| VREFH | 1.4V | 1.4V |

Fig. 8

| MOSFET | Initial Conditions | | Final Conditions | |
|---|---|---|---|---|
| | Vgs | Status | Vgs | Status |
| P1 | 0 | OFF | VDDSRC-VREFL = 0.96V | ON |
| N1 | 0 | OFF | VDDSRC = 1.32V | ON |
| N2 | 0 | OFF | VDDSRC = 1.32V | ON |
| N3 | 0 | OFF | VREFH | ON |
| N4 | Vth | ON | Vth | ON |
| N5 | Vth | ON | Vth | ON |
| N6 | VREFH | ON | 0V | OFF |
| N7 | 0 | OFF | VDDST-Vth = 0.4V | ON |
| N8 | VREFM | ON | VREFM-Vth = 0.4V | ON |
| N9 | 0 | OFF | Vth | ON |

Fig. 9

| Node | Initial Conditions | Final Conditions |
|---|---|---|
| VDDDST | 1.8V | 1.8V |
| VDDSRC | 0V | 1.65V |
| VDD_DIV | 0V | 1.65V |
| PSNIFF_INT | 1.8V | 0V |
| NET_N | 0V | 1.4V |
| PWROK | 0V | 1.8V |
| VREFL | 0.7V | 0.7V |
| VREFM | 0.8V | 0.8V |
| VREFH | 1.4V | 1.4V |

Fig. 10

| MOSFET | Initial Conditions | | Final Conditions | |
|---|---|---|---|---|
| | Vgs | Status | Vgs | Status |
| P1 | 0 | OFF | VDDSRC -VREFL = 0.95V | ON |
| N1 | 0 | OFF | VDDSRC = 1.65V | ON |
| N2 | 0 | OFF | VDDSRC = 1.65V | ON |
| N3 | 0 | OFF | 1.4V | ON |
| N4 | Vth | ON | Vth | ON |
| N5 | Vth | ON | Vth | ON |
| N6 | VREFH | ON | 0V | OFF |
| N7 | 0 | OFF | VDDDST-VREFH = 0.4V | ON |
| N8 | VREFM | ON | VREFM-Vth = 0.4V | ON |
| N9 | 0 | OFF | Vth | ON |

Fig. 11

OVER-VOLTAGE TOLERANT POWER SUPPLY SENSING CIRCUIT WITH PROGRAMMABLE TRIP-POINT

BACKGROUND

Power sensing circuits (also referred to as power sniffer circuits) play an important role in sensing supply voltage during power ramp-up to ensure the power supply of interest has reached minimum value for proper operation or has crossed the ramp-down threshold value indicating proper operation is no longer possible. The power sense circuit generates a power ok (PWROK) signal to indicate when the power supply is at a satisfactory level for proper operations. FIG. 1 illustrates a conventional power sense circuit 100. The transmission gate 102 transfers the input voltage 104 to be sensed having a high voltage level of VDDSRC to the gates of M1 and M2. Referring to FIGS. 1 and 2, when the input voltage 104 rises above the voltage trip point 106, M1 turns on and pulls the power sniff internal node (PSNIFF_INT) 108 to ground. The inverting Schmitt trigger circuit 110 and pair of inverters 112 cause the PWROK signal to assert. When PWROK asserts sufficiently to turn on M3 the internal node PSNIFF_INT is pulled to ground through M2 (turned on by input voltage 104) and M3 in addition to being pulled to ground by M1. Note that in FIG. 1 VDDDST reaches an operational level prior to VDDSRC reaching the trip point. During power ramp-down, the sense circuit 100 de-asserts the PWROK signal when the trip point voltage 106 is again reached (ignoring any hysteresis).

BRIEF DESCRIPTION OF THE DRAWINGS

The present invention may be better understood, and its numerous objects, features, and advantages made apparent to those skilled in the art by referencing the accompanying drawings.

FIG. 6 shows the initial and final voltages for various nodes in the power sense circuit as VDDSRC goes from 0V to 0.6V.

FIG. 7 illustrates initial and final conditions for Vgs for various MOSFETs in the power sense circuit and the on/off status of the various MOSFETS.

FIG. 8 shows the initial and final voltages for various nodes in the power sense circuit with VDDSRC having a nominal value of 1.2V.

FIG. 9 illustrates initial and final conditions for Vgs for various MOSFETs in the power sense circuit and the on/off status of the various MOSFETS with VDDSRC having a nominal value of 1.5V.

FIG. 10 shows the initial and final voltages for various nodes in the power sense circuit with VDDSRC having a nominal value of 1.5V.

FIG. 11 illustrates initial and final conditions for Vgs for various MOSFETs in the power sense circuit and their on/off status with VDDSRC having a nominal value of 1.5V.

The use of the same reference symbols in different drawings indicates similar or identical items.

DETAILED DESCRIPTION

Figures 1, 2:
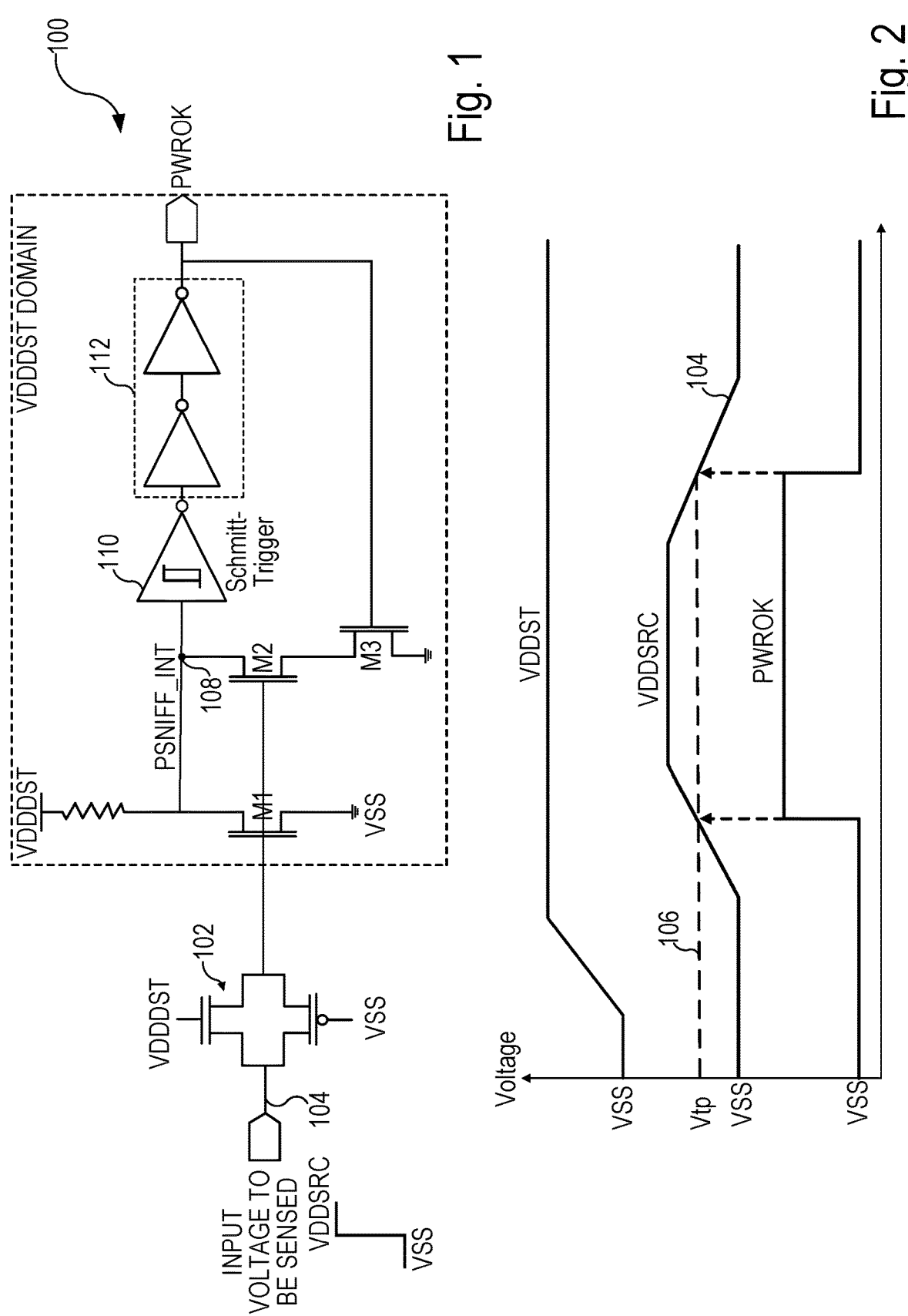
FIG. 1 illustrates a conventional power sense circuit.
FIG. 2 is a timing diagram associated with the conventional power sense circuit.

Embodiments herein provide a power sense circuit for use in multiple voltage domain designs that senses input voltage from a source (VDDSRC) domain in a destination (VDDDST) (output supply) domain. Embodiments also offer programmable sensing trip-points based on the voltage level of the VDDSRC domain to support different input/output applications such as temperature sensing (TSEN) and general purpose input/output (GPIOs). Embodiments of the power sense circuit include voltage protection devices to ensure that the potential difference between any two terminals of a device in the power sense circuit in the VDDDST voltage domain does not exceed the maximum tolerance limit set by a particular technology, e.g., 1.5V, thus ensuring satisfactory aging and improved reliability of the devices.

In 5 nm technology, a foundry may support only 1.5V thick-oxide devices, which can support up to a maximum voltage of 1.65V across any two terminals. However, the input/output (I/O) circuits often still need to operate at higher voltages like 1.8V to support various I/O applications. 1.8V operations exceed the tolerance limit of the 5 nm technology devices potentially leading to over-voltage stress of the devices. Embodiments described herein avoid over-voltage stress by stacking transistors, biasing them with intermediate reference voltages, leveling down high voltage signals using the level-shift logic, and leveling up low voltage signals using level shift logic. Similar problems seen in lower technology nodes like 3 nm and beyond can be mitigated with the strategies described herein. The architecture described herein is well suited for multi-voltage designs in lower voltage technology nodes where device reliability is a major concern for high voltage operation. The proposed power sensing architecture can be used in different multi-voltage designs for addressing power sequencing requirements. The proposed architecture can be extremely useful for applications that operate on a wide range of input supply voltages such as Sound Wire I/O (SWIO).

While conventional power sense circuits can have some hysteresis between a ramp-up and a ramp-down trip-point, the trip point is not scalable for different ranges of input supplies. Embodiments herein provide a programmable trip-point selection to provide different trip-points for different input supply domains, e.g., having nominal values of 0.75V, 1.2V, and 1.5V. Providing a programmable trip-point selection in a single design eliminates the need for dedicated power sniffer cells in a library for the respective input supply domains, which significantly reduces library development and maintenance effort.

Although the slew rate of the input supply voltage to be sensed can vary from μs to ms, conventional power sense circuits malfunction at faster slew rates. Embodiments of power sense circuits described herein make use of extra bias voltage to support a faster slew rate and generate a PWROK signal for glitch-free operation in analog and mixed signal circuits.

Figure 3:
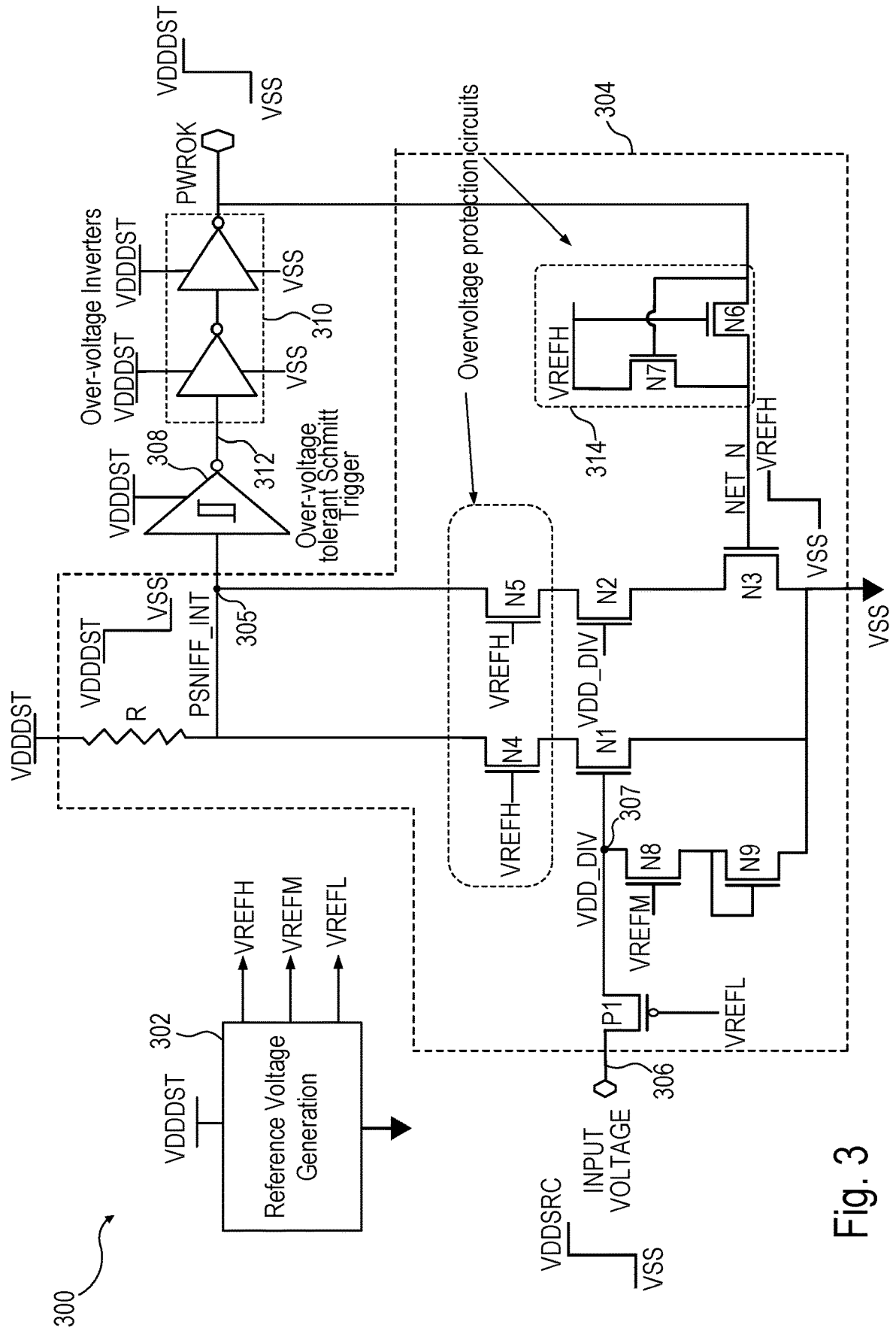
FIG. 3 illustrates an embodiment of a power sense circuit.

Referring to FIG. 3, an embodiment of a power sense circuit 300 includes a reference voltage generation circuit 302 that generates reference voltages using a resistor divider on the VDDDST supply. The reference voltage generation block generates three voltages, VREFH (reference voltage high) used to bias n-channel metal oxide semiconductor (NMOS) devices, VREFL (reference voltage low) used to to to provide trip point programmability, and VREFM (reference voltage mid) to bias NMOS device N8 used in the discharge path from VDD_DIV to VSS and to bias PMOS devices in the Schmitt trigger device 308 discussed further below.

Figure 4:
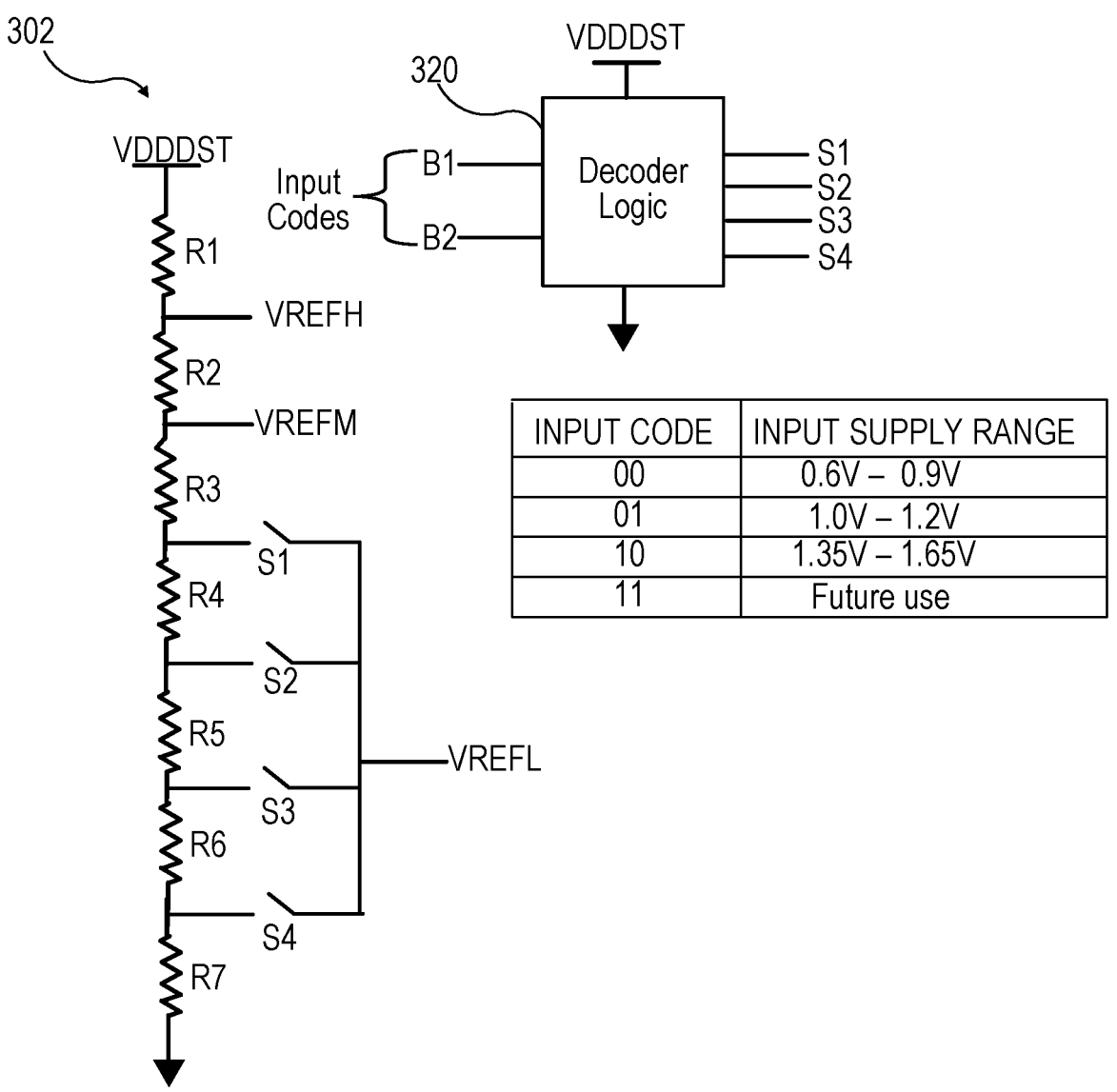
FIG. 4 illustrates a reference voltage generation circuit that generates voltages for use in the power sense circuit.

The reference voltage generation circuit is shown in more detail in FIG. 4. The resistor divider shown in FIG. 4 includes programmable switches S1, S2, S3, and S4, which are controlled through decoder control bits B1 and B2 to select different values of VREFL. A 2:4 decoder logic block 320 selects the switch settings for different VREFL values based on the input codes. The control bits B1 and B2 select different switch settings suitable for different input supply ranges. Of course, the number of switch settings and particular input supply ranges will vary according to application requirements. For each input code, one of the switches is closed and the remaining switches remain open. For example, for input code 00 (0.6V -0.9V), switch S4 is closed and the remaining switches S1-S3 remain open.

Referring back to FIG. 3, the power sense circuit includes a voltage sense block 304 that senses the input voltage 306, which varies between VSS and VDDSRC. The voltage sense block produces output signal PSNIFF_INT in the VDDDST domain on node 305. An over-voltage tolerant Schmitt-trigger circuit 308 receives the PSNIFF_INT signal to remove input noise and provide hysteresis. While not shown for ease of illustration in FIG. 3 (see FIG. 12 for greater detail), the Schmitt-trigger circuit 308 also receives VREFH, VREFM, and VSS. The over-voltage inverters 310 improve the drive-strength of the output signal 312 of the over-voltage tolerant Schmitt trigger circuit to generate the final output PWROK.

The voltage sense block includes protection devices to reduce over-voltage stress. Protection devices N4 and N5 are stacked with transistors N1 and N2, respectively, to eliminate over-voltage stress on N1 and N2. The gates of transistors N4 and N5 are biased with VREFH to avoid gate-oxide breakdown and thereby protect N1 and N2. The NMOS level shift logic 314 includes transistors N6 and N7, which are coupled to the gate terminal of N3 to mitigate electrical over-stress. When output signal "PWROK" swings from VSS to VDDDST, the NMOS level shift logic 314 levels-down the swing on NET_N from VSS to VREFH, thereby protecting the device N3.

Power supply sense circuit 300 also achieves fast response time by generating an extra bias voltage VREFM and providing VREFM to the gate of transistor N8. As the input voltage 306 ramps down from VDDSRC to below VREFL+Vth (of P1), PMOS P1 turns OFF. The N8 and N9 devices create the discharge path for the node VDD_DIV 307 to ground. The residual charge on the net VDD_DIV is pulled to ground (VSS) by N8 and the diode-connected metal oxide semiconductor field effect transistor (MOSFET) N9, thus ensuring PSNIFF_INT goes to VDDDST and PWROK goes to VSS when the input voltage 306 goes below VREFL+Vth (of P1).

The power sense circuit 300 also provides a programmable trip-point for the VDDSRC supply to support a wide range of input voltages, varying in an embodiment from 0.6V to 1.65V. That is achieved by biasing transistor P1 with the programmable VREFL voltage level to ensure the power sense circuit asserts PWROK only when the input voltage 306 goes beyond the value of VREFL+Vth. The desired value of VREFL voltage is programmed using the S1, S2, S3, and S4 switches shown in FIG. 4. A single power sense circuit can be used to support a wide range of source domain supply voltages ranging, e.g., from 0.6V -1.5V, thus eliminating the need for multiple power sense circuits for each of the possible source domain supply voltages. In addition, as power sense circuit 300 offers trip-point programmability, it is possible to adjust the trip-points based on silicon observation and avoid chip failures.

The aging and reliability requirements of the power sense circuit 300 is met as the risk of device failure due to electrical over-stress is addressed by employing stacking and biasing of devices appropriately along with level shift logic. The approach of power sense circuit 300 can be used in various multi-voltage domains such as I/Os, temperature sensing circuits, and a PowerOK generation module in low dropout regulator (LDO) circuits.

Figure 5:
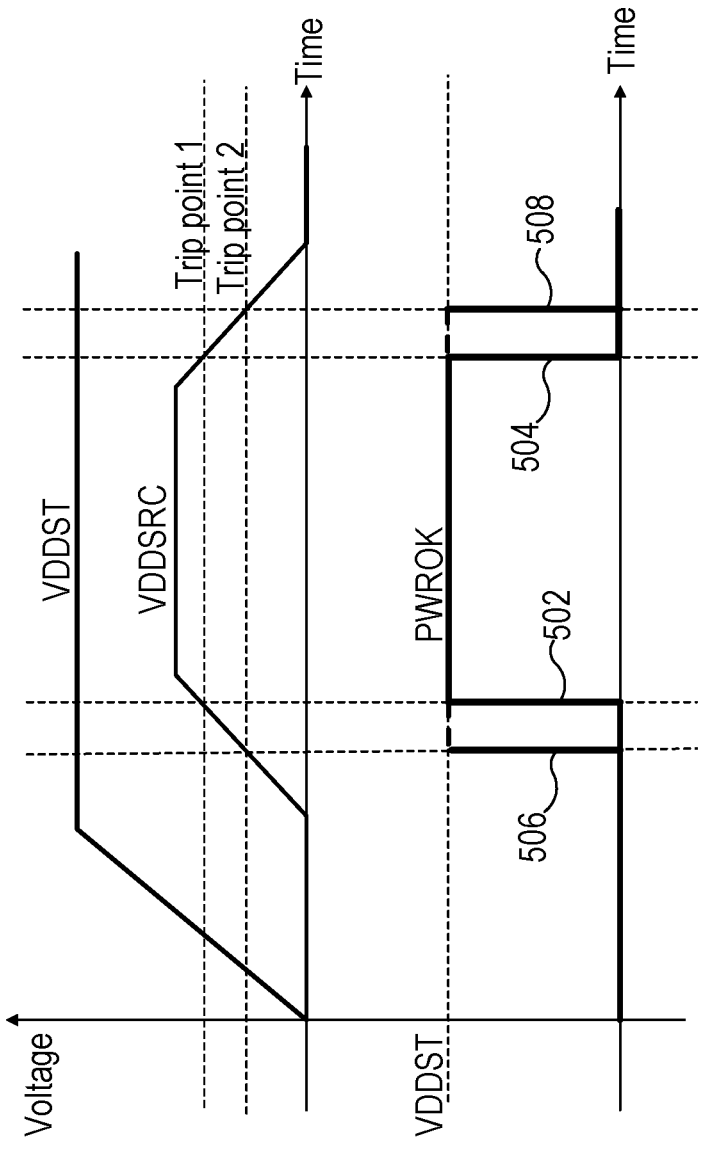
FIG. 5 is a timing diagram showing multiple trip points for the power sense circuit.

As discussed above, the P1 device gate is biased to provide a programmable trip point for various ranges of source voltages from the VDDSRC domain. FIG. 5 illustrates the operation of the power sense circuit 300 with multiple trip points. Assume that the VDDDST voltage domain has good power before the VDDSRC voltage domain. By selecting a first bias voltage for the gate of P1, trip point 1 is selected as the trip point. In that case the PWROK signal asserts at 502 and de-asserts at 504 when that trip point is crossed at power down (ignoring any hysteresis). By selecting a second bias voltage lower than the first bias voltage for the gate of P1, trip point 2 is selected as the trip point. In that case the PWROK signal asserts at 506 and de-asserts at 508.

Several different scenarios describe the operation of the power sense circuit 300. For scenario 1, Table 1 shows the input voltage, output voltage and trip-points.

TABLE 1

|  | Min | Max |
| --- | --- | --- |
| VDDDST (Output voltage) | 1.62 V | 1.98 V |
| VDDSRC (Input voltage) | 0.6 V | 0.9 V |
| Trip-point | 0.5 V | 0.6 V |

For the first scenario VDDSRC ranges 0.6V to 0.9V minimum to maximum with a nominal voltage of 0.75V and VDDDST is nominally 1.8V. Assume the maximum threshold voltage Vth for the MOSFETs in FIG. 3 is 0.4V. Table 1 shows VDDDST has a maximum voltage of 1.98V and a minimum voltage of 1.62V. That is ±10% of the nominal voltage. VDDSRC varies from a minimum of 0.6V to a maximum of 0.9V. The minimum trip point is 0.5V and the maximum trip point is 0.6V. Referring to FIG. 6, the table shows the initial and final voltages for various nodes in the power sense circuit 300 as VDDSRC goes from 0V to 0.6V. FIG. 7 illustrates initial and final conditions for Vgs for various MOSFETs in power sense circuit 300 and their on/off status. Initially N8 is ON with a Vgs=0.8V and N9 is a diode connected NMOS (initially N9 is off). Once the input signal rises, N9 turns on. A VREFM value of 0.8V is sufficient to configure N8 and N9 as a weak pulldown. N8 and N9 will pull-down the node VDD_DIV to VSS. The node PSNIFF_INT is pulled to VDDDST by resistor R. N6 is ON with Vgs=VREFH. N7 is OFF since it has Vgs=VSS. Node NET_N=VSS and N3 is OFF.

For ramp up, as the input voltage ramps up towards VDDSRC and crosses the level of VREFL+Vth, P1 turns ON and passes the input voltage to the VDD_DIV node 307. Since all 3 MOSFETs P1, N8 and N9 are ON, they will form a voltage divider at node VDD_DIV. N8 and N9 are sized with significantly less width than P1 such that VDD_DIV will be pulled towards VDDSRC when P1 turns ON completely. MOSFET P1 is sized with a greater width than N8 and N9 so that P1 turns ON strongly with a good (Vgs-Vth) margin when VDDSRC reaches 0.5V. When P1 turns ON it over-powers the weak pull-down network of N8 and N9, such that the node VDD_DIV is pulled up to the VDDSRC level. Hence, VREFL should be close to 0V for this scenario. As the source voltage of P1 is passed to the drain node VDD_DIV, MOSFET N1 turns on. MOSFETs N4 and N5 are used for over-voltage protection and are always ON. N4 and N5 are sized with greater width than N1 and N2 such that when VREFH is at 1.4V, the source of N4 and N5 will settle at VREFH-Vth i.e., 1.0V. When NI turns ON with a Vgs of 0.5V, both NMOS N1 and N4 are ON and pull down the node PSNIFF_INT 305 to VSS.

This in turn causes the PWROK signal to go to VDDDST, which will be seen as the gate voltage for N7. The voltage at the gate of N7 causes the voltage at node NET_N to be VREFH, i.e., 1.4V. Hence N3 will also turn on resulting in a strong pull-down of node PSNIFF_INT. The final conditions of the MOSFETs and node voltages are shown in the table of FIG. 7.

For ramp down, MOSFET P1 turns off once the input voltage to be sensed falls below VREFL+Vth of P1. All the other node voltages and the MOSFET statuses return to the initial conditions shown in FIGS. 6 and 7.

For scenario 2 the source supply VDDSRC from the core domain is changed to a nominal value of 1.2V. Here the trip point specification differs from that of case 1 as shown in Table 2.

TABLE 2

|  | Min | Max |
| --- | --- | --- |
| VDDDST (Output voltage) | 1.62 V | 1.98 V |
| VDDSRC (Input voltage) | 1.08 V | 1.32 V |
| Trip-point | 0.76 V | 0.92 V |

For scenario 2, VDDSRC =1.2V and VDDDST=1.8V. Assume the maximum Vth of the MOSFETs is 0.4V. VDDDST has a maximum voltage of 1.98V and a minimum voltage of 1.62V. VDDSRC varies from a minimum of 1.08V to a maximum of 1.32V (±10% from the nominal value of 1.2V). The minimum trip point is 0.76V and the maximum trip point is 0.92V. The initial and final voltages for the various nodes are shown in FIG. 8. The initial and final Vgs and on/off status for the various MOSFETS are shown in FIG. 9. To meet the trip point specification, the VREFL voltage changes from 0.1V to 0.36V and the remaining circuit operation is the same as scenario 1.

For scenario 3, the source voltages VDDSRC changes to 1.5V and VDDDST remains at 1.8 V. Thus, as shown in Table 3, VDDDST minimum is 1.62V and maximum is 1.98V. VDDSRC minimum is 1.35V and maximum is 1.65V. The trip point minimum is 1.1V and the trip point maximum is 1.25V.

TABLE 3

|  | Min | Max |
| --- | --- | --- |
| VDDDST (Output voltage) | 1.62 | 1.98 |
| VDDSRC (Input voltage) | 1.35 | 1.65 |
| Trip-point | 1.1 | 1.25 |

To meet the trip point specification, the VREFL voltage changes to 0.7V and the remaining circuit and operations are same as in scenario 1 and scenario 2. FIG. 10 shows the initial and final voltages for the various nodes of power sense circuit 300 and FIG. 11 shows the initial and final Vgs and on/off status for the various MOSFET devices.

Figure 12:
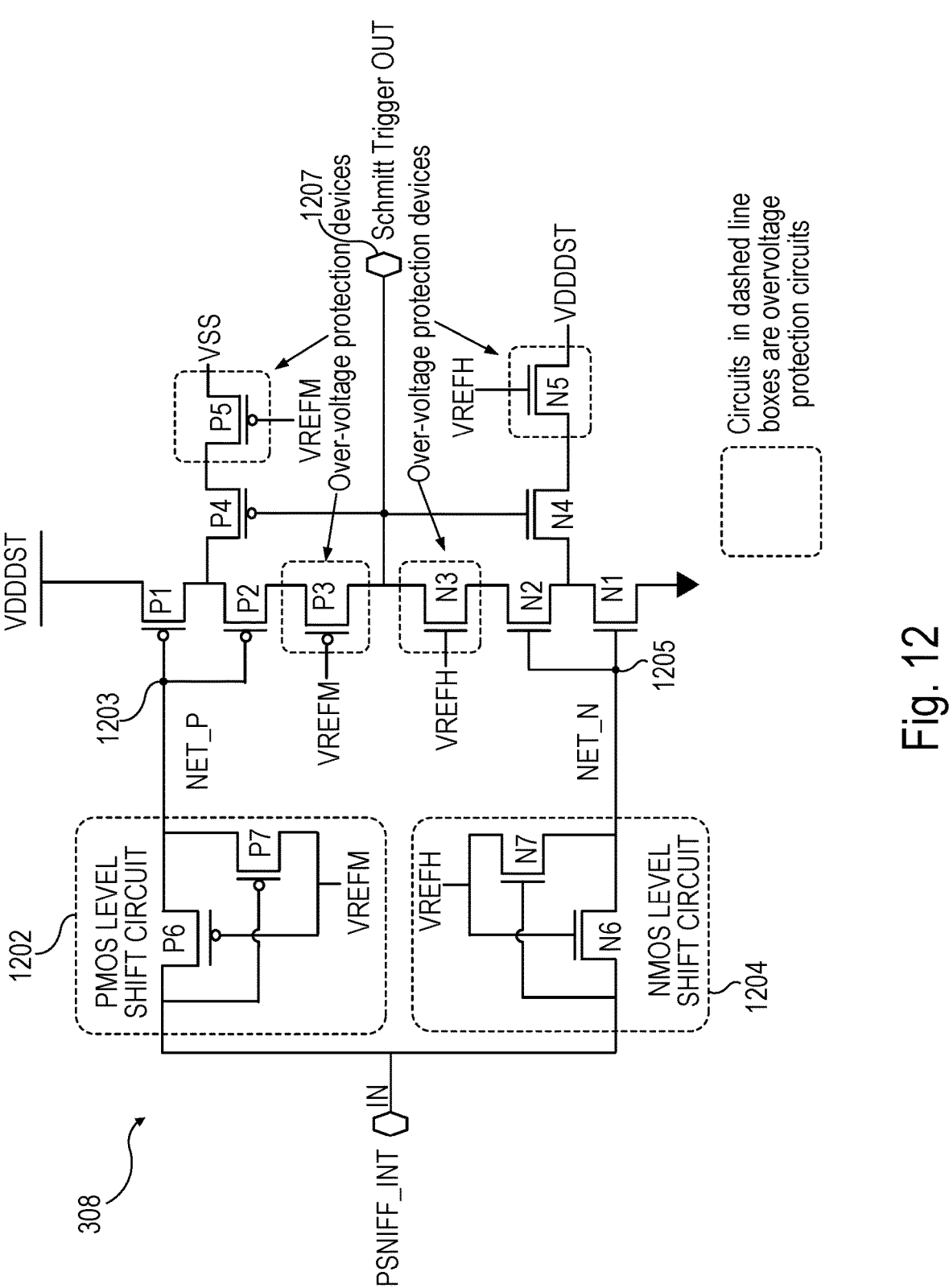
FIG. 12 illustrates an embodiment of an over-voltage tolerant Schmitt trigger circuit.

Referring to FIG. 12, the embodiment of the over-voltage tolerant Schmitt trigger circuit 308 (see FIG. 3) protects devices in the Schmitt trigger circuit from over-voltage stress using reference voltage-based techniques. The Schmitt trigger circuit 308 included in the output path from PSNIFF_INT to PWROK provides hysteresis while mitigating any over-voltage stress issues.

Still referring to FIG. 12, the reference voltages from reference voltage generation circuit 302 (see FIGS. 3 and 4) are used to level shift up/down the input voltage (IN) from the PSNIFF_INT node 305 shown in FIG. 3. The PMOS level shift circuit 1202 and the NMOS level shift circuit 1204 ensure that the input to the Schmitt trigger circuit 308 is within tolerable voltage limits to avoid over-voltage stress for the Schmitt trigger devices.

The PMOS level shift circuit 1202 circuit uses VREFM from the reference voltage generation circuit 302 and generates an output on NET_P 1203. The input voltage to the Schmitt trigger is steady state 0 V or 1.8V from PSNIFF_INT. The PMOS level shift circuit 1202 converts an input voltage of 0V to an output voltage of VREFM on NET_P 1203. An input voltage of 1.8V results in an output voltage of 1.8V on NET_P 1203. That ensures that the minimum voltage on NET_P is greater than or equal to VREFM. The PMOS level shift circuit 1202 circuit functions to avoid overvoltage stress conditions for the PMOS transistors P1 and P2 in FIG. 12. The PMOS devices P1 and P2 see a maximum source to gate voltage difference of 1.8V–VREFM across the terminals. Hence, the logic low of IN signal is level shifted up to VREFM, thus ensuring that the PMOS devices in the P1 and P2 operate under stress free conditions.

The NMOS level shift circuit 1204 uses VREFH as an input from the reference voltage generation circuit 302 and generates an output on NET_N 1205. The NMOS level shift logic converts a 1.8V input voltage to VREFH on output NET_N 1205. The NMOS level shift logic converts a 0V input voltage to 0V on output NET_N 1205. The NMOS level shift circuit 1204 ensures that the maximum voltage on NET_N less than or equal to VREFH. The NMOS level shift circuit 1204 ensures overvoltage stress conditions are avoided for the NMOS devices N1 and N2 in FIG. 12. The NMOS devices N1 and N2 will see a maximum source to gate voltage difference of VREFH (VREFH–0V) across the terminals of NMOS devices. Hence, the logic high of IN signal is level shifted down to VREFH, thus, ensuring that the NMOS devices N1 and N2 in the Schmitt trigger circuit 308 operate under stress free conditions.

In addition to the PMOS and NMOS level shift circuit 1202 and 1204, the Schmitt trigger circuit 308 includes protection devices P3, P5, N3 and N5 as shown in FIG. 12. Those devices protect, respectively the P2, P4, N2 and N4 devices from overvoltage stress conditions. Consider the following example. Assume that NET_P has a voltage of 1.8V and NET_N=VREFH, which turns off the PMOS devices P1 and P2 and turns on the NMOS devices N1 and N2. That pulls the Schmitt trigger OUT signal 1207 to 0V. For PMOS device P2, the gate voltage is 1.8V and in the absence of protection device P3 a voltage of 1.8V would be seen across the gate to drain terminals of PMOS P2. That would cause overvoltage stress issues for PMOS device P2, which is avoided by using protection device P3, which has a gate voltage of VREFM. The protection device P3 ensures that the minimum voltage on the drain of PMOS P2 will be VREFM+$V_{TP3}$ (threshold voltage of P3). Hence, when the output OUT is 0V, the drain of PMOS P2 will be VREFM+$V_{TP3}$. The voltage difference will be 1.8V−(VREFM+$V_{TP3}$), which is less than the maximum device tolerance voltage of, e.g., 1.5V. Similarly, the devices P5, N3 and N5 with gate voltages as VREFM or VREFH act as protection devices respectively for PMOS P4, and NMOS devices N2 and N4.

Figure 13:
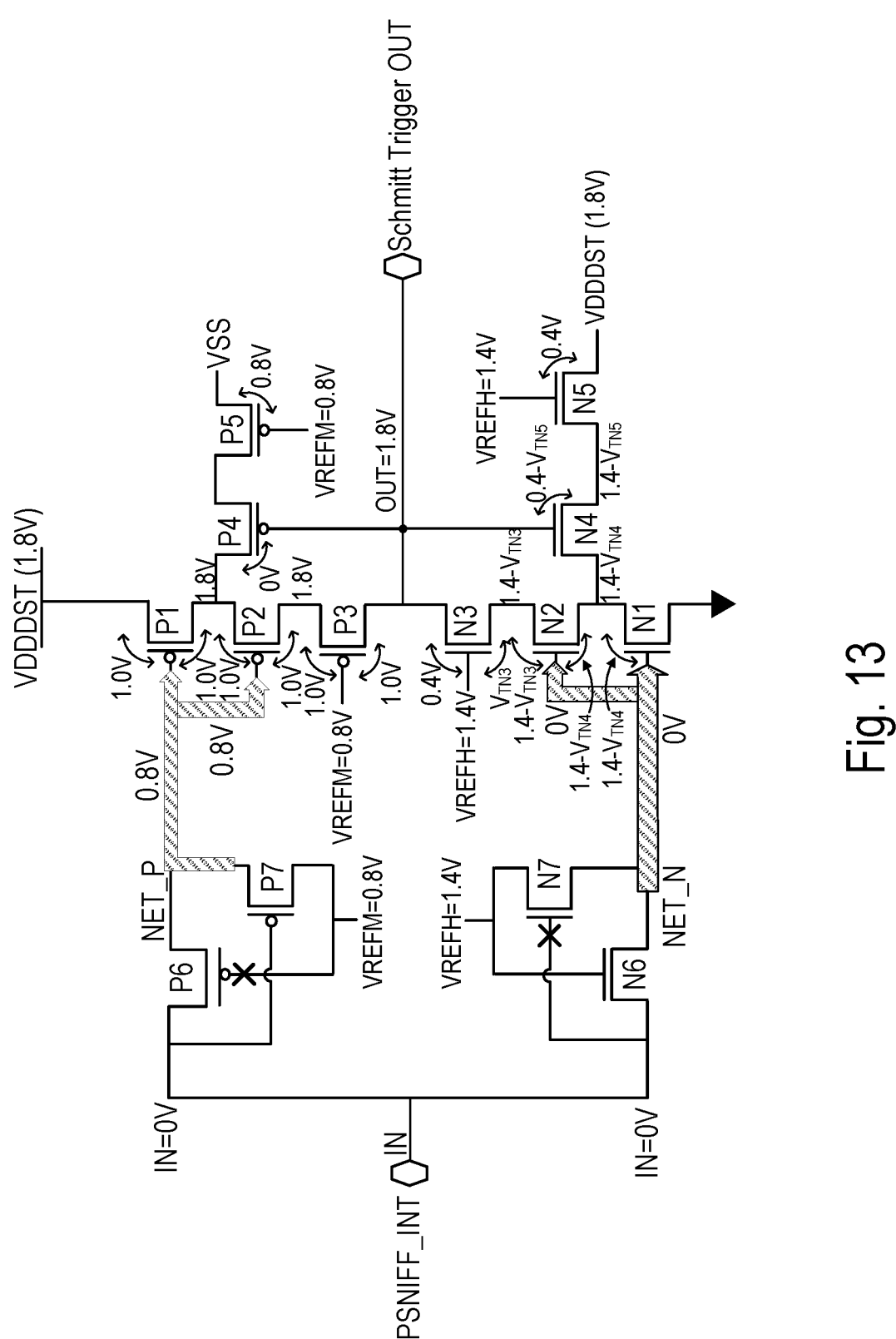
FIG. 13 illustrates various voltages between terminals of MOSFETs in the over-voltage tolerant Schmitt trigger circuit with an input voltage at 0V.

To better understand the working of the Schmitt trigger circuit 308 consider the following two scenarios. In the first scenario, the supply voltage is VDDDST is fully ramped up (1.8V) and the input IN from node PSNIFF_IN is a low logic level (0V). Assume VREFH=1.4V and VREFM=0.8V. FIG. 13 shows that with VREFM as an input to the PMOS level shift logic with a voltage of 0.8V, the PMOS device P7 is turned on and P6 is turned OFF as indicated by the "X" on the gate terminal node. Hence, the PMOS level shift logic level shifts up the NET_P voltage from input IN voltage of 0V to VREFM, i.e., 0.8V. Similarly, with VREFH as an input to the NMOS level shift logic with input voltage of 1.4V, the NMOS device N6 is turned on and N7 is turned off as indicated by the X on the gate terminal node. Hence, the NMOS level shift logic passes the input IN voltage of 0V to NET_N. With the voltage on NET_P=0.8V, the PMOS devices P1, P2, and P3 are turned-on with a gate voltage (NET_P) of 0.8V and NMOS devices N1 and N2 are turned-off as the gate voltage (NET_N) is 0V. As a result, the output of the Schmitt trigger output OUT switches to 1.8V. As the OUT switches to 1.8V, PMOS devices P4 and P5 turn off and NMOS devices N4 and N5 turn on. As a result, the PMOS devices are operating under stress free conditions as:

$$V_{SG(P1,P2,P3)} = 1.0 \text{ V} < 1.5 \text{ V and } V_{SG(P4,P5)} < 1.5 \text{ V.}$$

Similarly, the NMOS devices are operating under stress free conditions as:

$$V_{GS(N1,N2,N3,N4,N5)} < 1.5 \text{ V.}$$

FIG. 13 illustrates the various voltages between device terminals showing that over-voltages stress conditions are avoided.

Figure 14:
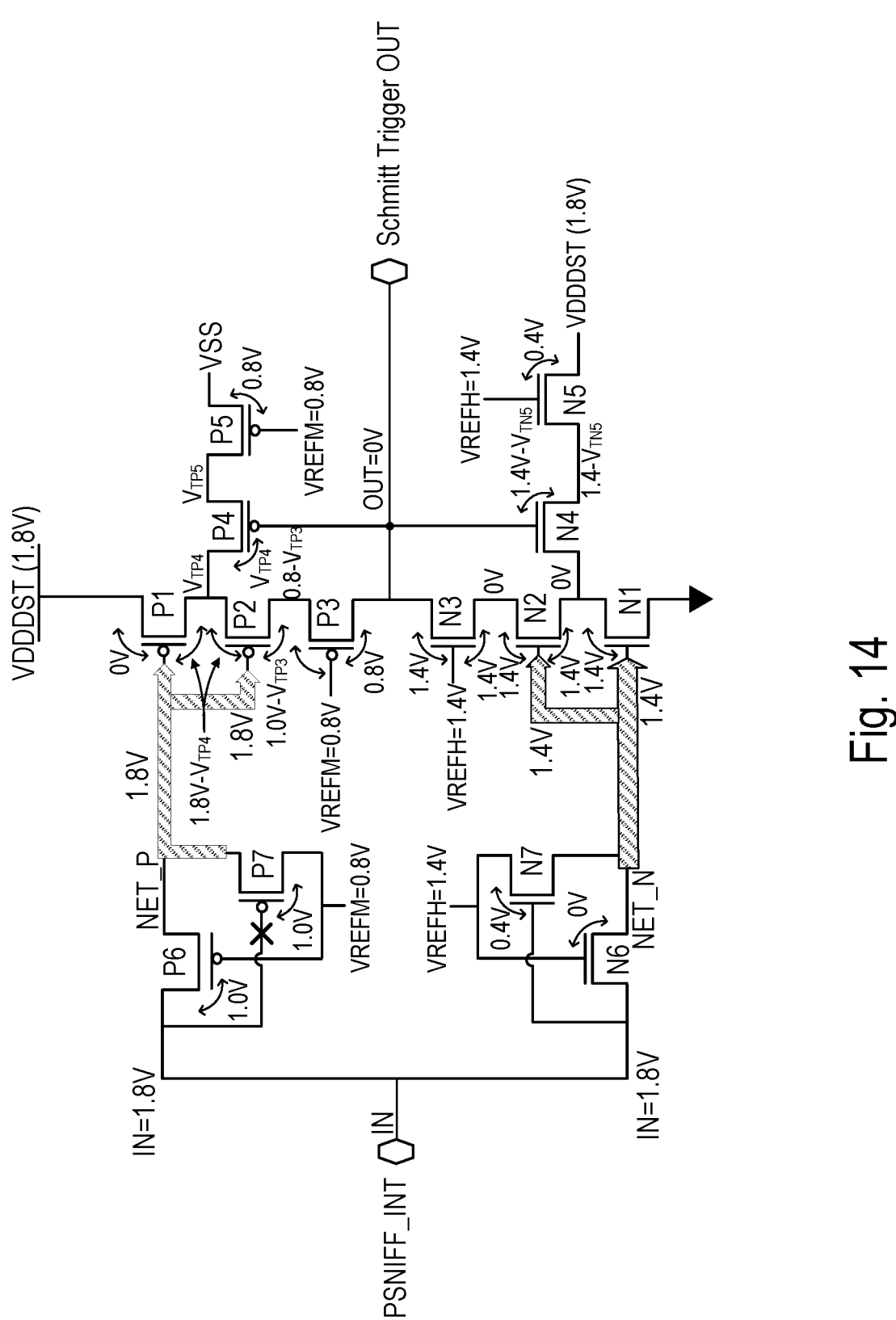
FIG. 14 illustrates various voltages between terminals of MOSFETs in the over-voltage tolerant Schmitt trigger circuit with the input voltage at 1.8V.

FIG. 14 illustrates a second scenario in which the input IN from the PSNIFF_INT node is 1.8V. The reference voltage block generates VREFH and VREFM. For this scenario assume VREFH=1.4V and VREFM=0.8V. With VREFM of 0.8V as an input to the PMOS level shift logic and IN voltage =1.8V, the PMOS device P7 is turned off as indicated by the X and P6 is turned on. Hence, the PMOS level shift logic level passes the IN voltage to NET_P. As a result, NET_P is 1.8V.

Similarly, with VREFH=1.4V as an input to the NMOS level shift logic and IN as 1.8V, the NMOS device N6 acts as pass gate and passes only VREFH-$V_{TN6}$ to NET_N and as N7 also turns on it pulls the input NET_N to the VREFH voltage of 1.4V . Hence, the NMOS level shift logic level down the IN voltage of 1.8V to 1.4V. As NET_P=1.8V, the PMOS devices P1, P2, and P3 are turned-off with a gate voltage of 1.8V and NMOS devices N1, N2, and N3 are turned-on with a gate voltage (NET_N) of 1.4V. As a result, the output of the Schmitt trigger OUT switches to 0V. As OUT switches to 0V, this turns on the PMOS devices P4 and

P5 and turns off the NMOS devices N4 and N5. As a result, the NMOS devices are operating under stress free conditions as:

$$V_{GS(N1,N2,N3)} = 1.4 \text{ V} < 1.5 \text{ V}$$

$$V_{GS(N4,N5)} < 1.5 \text{ V}$$

Similarly, the PMOS devices are operating under stress free conditions as:

$$V_{SG(P1,P2,P3,P4,P5)} < 1.5 \text{ V}$$

Thus, the over-voltage tolerant Schmitt trigger circuit 308 removes noise and provides hysteresis while ensuring that over-voltage stress is avoided by using level shift circuits and other protections devices.

Thus, an over-voltage tolerant power supply sensing circuit has been described. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. A power sensing circuit in a first voltage domain comprising:

a voltage sense portion to sense an input voltage from a second voltage domain and generate an internal voltage sense signal on an internal voltage sense node indicative of the input voltage, the voltage sense portion including, a plurality of NMOS over-voltage protection devices; and a trip point device coupled between the input voltage and an internal trip point node, the trip point device having a gate terminal coupled to a low reference voltage, the trip point device configured to turn on and pass the input voltage to the internal trip point node responsive to the input voltage becoming greater than a threshold voltage level;

a reference voltage generation circuit in the first voltage domain to generate the low reference voltage, a mid-reference voltage, and a high reference voltage, the high reference voltage being coupled to the NMOS over-voltage protection devices;

an NMOS transistor biased by the mid-reference voltage and coupled between the internal trip point node and a diode connected transistor that is coupled between the NMOS transistor and a ground node; and wherein the power sensing circuit supplies a power sense output node with a power sense output signal indicative of whether the input voltage is above the threshold voltage level.

2. The power sensing circuit as recited in claim 1 wherein the high reference voltage is lower than a supply voltage of the first voltage domain and the low reference voltage is higher than a ground voltage on the ground node.

3. The power sensing circuit as recited in claim 1 further comprising:

an over-voltage tolerant Schmitt trigger circuit having a Schmitt trigger circuit input coupled to the internal voltage sense node; and a plurality of inverters coupled between an output of the over-voltage tolerant Schmitt trigger circuit and the power sense output node.

4. The power sensing circuit as recited in claim 3 wherein the over-voltage tolerant Schmitt trigger circuit comprises:

a PMOS level shift circuit including first and second PMOS transistors to shift a low voltage on the Schmitt trigger circuit input to the mid-reference voltage;

an NMOS level shift circuit including first and second NMOS transistors to shift a high voltage on the Schmitt trigger circuit input to the high reference voltage; and an output stack of devices including, a first PMOS over-voltage protection device coupled between a Schmitt trigger circuit output node and a first PMOS stack transistor and the first PMOS over-voltage protection device having a PMOS over-voltage gate terminal coupled to the mid-reference voltage; and a first NMOS over-voltage protection device coupled between the Schmitt trigger circuit output node and an NMOS stack transistor and the first NMOS over-voltage protection device having an NMOS over-voltage gate terminal coupled to the high reference voltage.

5. The power sensing circuit as recited in claim 4 wherein the over-voltage tolerant Schmitt trigger circuit further comprises:

a second PMOS over-voltage protection device coupled between the ground node and a Schmitt trigger PMOS transistor and the second PMOS over-voltage protection device having a second PMOS over-voltage gate terminal coupled to the mid-reference voltage; and a second NMOS over-voltage protection device coupled between a supply voltage node of the first voltage domain and a Schmitt trigger NMOS transistor and the second NMOS over-voltage protection device having a second NMOS over-voltage gate terminal coupled to the high reference voltage.

6. The power sensing circuit as recited in claim 1 wherein a maximum supply voltage of the second voltage domain is lower than a maximum supply voltage of the first voltage domain and the maximum supply voltage of the first voltage domain is above a voltage tolerance of devices in the power sensing circuit.

7. The power sensing circuit as recited in claim 1 further comprising:

a first plurality of stacked devices in a first pull-down path between the internal voltage sense node and the ground node;

wherein the first plurality of stacked devices includes a first over-voltage protection device of the NMOS over-voltage protection devices coupled between the internal voltage sense node and a first pulldown device and the first over-voltage protection device has a first gate terminal coupled to the high reference voltage;

wherein the first pulldown device is coupled between the first over-voltage protection device and the ground node and has a second gate terminal coupled to the input voltage through a trip point device;

a second plurality of stacked devices in a second pull-down path between the internal voltage sense node and the ground node, the second plurality of stacked devices including a second over-voltage protection device of the plurality of NMOS over-voltage protection devices coupled between the internal voltage sense node and a second pull-down device, the second over-voltage protection device having a third gate terminal coupled to the high reference voltage;

wherein the second pull-down device is coupled between the second over-voltage protection device and a third pull-down device and a fourth gate terminal of the second pull-down device is coupled to the input voltage through the trip point device; and wherein the third pull-down device is coupled between the second pull-down device and the ground node and has a fifth gate terminal coupled to the power sense output node through a level shift circuit.

8. The power sensing circuit as recited in claim 7 wherein the level shift circuit comprises:

a third over-voltage protection device of the NMOS over-voltage protection devices;

a fourth over-voltage protection device of the NMOS over-voltage protection devices;

wherein the third over-voltage protection device is coupled between the power sense output node and the fifth gate terminal of the third pull-down device and the third over-voltage protection device has a sixth gate terminal coupled the high reference voltage; and wherein the fourth over-voltage protection device is coupled between the high reference voltage and the fifth gate terminal of the third pull-down device and the fourth over-voltage protection device has a seventh gate terminal coupled to the power sense output node.

9. The power sensing circuit as recited in claim 1 wherein a voltage value of the low reference voltage is programmable thereby allowing a trip point for the trip point device to be programmable.

10. The power sensing circuit as recited in claim 1 wherein the reference voltage generation circuit comprises a resistor ladder with programmable switches to select different values of the low reference voltage.

11. A method for sensing power comprising:

sensing in a power sensing circuit in a first voltage domain an input voltage from a second voltage domain;

protecting devices in the power sensing circuit in the first voltage domain from an overvoltage condition using a plurality of over-voltage protection devices;

generating a high reference voltage, a mid-reference voltage, and a low reference voltage for use by the power sensing circuit;

receiving the input voltage at a trip point device coupled between the input voltage and an internal trip point node;

supplying a gate terminal of the trip point device with the low reference voltage;

turning on the trip point device and passing the input voltage to the internal trip point node responsive to the input voltage becoming greater than a threshold voltage level;

biasing an NMOS transistor coupled between the internal trip point node and a diode connected transistor using the mid-reference voltage; and supplying a power sense output node with a voltage sense output signal indicative of whether the input voltage is above the threshold voltage level.

12. The method as recited in claim 11 wherein the high reference voltage is lower than a supply voltage of the first voltage domain used by the power sensing circuit and the low reference voltage is higher than a ground voltage.

13. The method as recited in claim 12 further comprising:

supplying Schmitt trigger circuit input of an over-voltage Schmitt trigger circuit having a Schmitt trigger circuit input coupled to an internal voltage sense node having a voltage value that varies between the supply voltage and the ground voltage; and protecting devices in the over-voltage Schmitt trigger circuit using a PMOS devices biased by the mid-reference voltage and NMOS protection devices biased by the high reference voltage.

14. The method as recited in claim 13 further comprising:

supplying a first inverter with an output of the over-voltage Schmitt trigger circuit; and supplying a second inverter with an output of the first inverter and supplying and the power sense output node with an output of the second inverter.

15. The method as recited in claim 11 wherein a maximum supply voltage of the first voltage domain is above a voltage tolerance of devices in the power sensing circuit.

16. The method as recited in claim 11 further comprising programming a voltage value of the low reference voltage to program a trip point for the trip point device.

17. A power sensing circuit in a first voltage domain to sense an input voltage from a second voltage domain, the power sensing circuit comprising:

a power sense output node to supply a power sense output signal indicative of the input voltage;

a voltage sense portion to sense the input voltage and generate an internal voltage sense signal on an internal voltage sense node indicative of the input voltage;

a reference voltage generation circuit to generate a plurality of reference voltages including a high reference voltage, a mid-level voltage, and a programmable low reference voltage;

an over-voltage tolerant Schmitt trigger circuit coupled between the internal voltage sense node and the power sense output node and coupled to receive the high reference voltage and the mid-level voltage as biasing voltages for respective protection transistors;

a first stack of transistors coupled between the internal voltage sense node and a ground node, the first stack of transistors including a first protection device biased by the high reference voltage;

a second stack of transistors coupled between the internal voltage sense node and the ground node, the second stack of transistors including a second protection device biased by the high reference voltage;

a level shift circuit coupled between a gate terminal of one of the second stack of transistors and the power sense output node; and a trip point device in the voltage sense portion coupled to pass the input voltage when the input voltage is above a trip point, the trip point being determined, at least in part, according to a value of the programmable low reference voltage coupled to a gate terminal of the trip point device.

18. The method as recited in claim 11 further comprising:

generating the low reference voltage using a resistor ladder; and setting a value of the low reference voltage using programmable switches in the resistor ladder.

* * * * *